(12) United States Patent
Ishikawa et al.

(10) Patent No.: US 11,714,312 B2
(45) Date of Patent: Aug. 1, 2023

(54) DISPLAY DEVICE AND DISPLAY PANEL

(71) Applicant: Japan Display Inc., Tokyo (JP)

(72) Inventors: Tomokazu Ishikawa, Tokyo (JP); Masaru Nakakomi, Tokyo (JP); Masashi Shishikura, Tokyo (JP)

(73) Assignee: Japan Display Inc., Tokyo (JP)

( * ) Notice: Subject to any disclaimer, the term of this patent is extended or adjusted under 35 U.S.C. 154(b) by 76 days.

(21) Appl. No.: 17/455,253

(22) Filed: Nov. 17, 2021

(65) Prior Publication Data

US 2022/0075228 A1 Mar. 10, 2022

Related U.S. Application Data

(63) Continuation of application No. PCT/JP2020/020416, filed on May 22, 2020.

(30) Foreign Application Priority Data

May 23, 2019 (JP) ................................. 2019-096932

(51) Int. Cl.
*H04M 1/02* (2006.01)
*G02F 1/1335* (2006.01)
*G02F 1/1333* (2006.01)
*G02F 1/1339* (2006.01)

(52) U.S. Cl.
CPC ...... *G02F 1/133512* (2013.01); *G02F 1/1339* (2013.01); *G02F 1/133308* (2013.01)

(58) Field of Classification Search
None
See application file for complete search history.

(56) References Cited

U.S. PATENT DOCUMENTS

| 2006/0262253 | A1 | 11/2006 | Teramoto et al. |
| 2013/0258234 | A1 | 10/2013 | Park et al. |
| 2015/0223297 | A1 | 8/2015 | Sato |
| 2017/0123452 | A1 | 5/2017 | Evans, V et al. |
| 2020/0292871 | A1* | 9/2020 | Inoue ................ G02F 1/133308 |
| 2021/0018793 | A1* | 1/2021 | Zhang ............... G02F 1/133512 |

FOREIGN PATENT DOCUMENTS

| CN | 104821139 A | 8/2015 |
| JP | 2006-343728 A | 12/2006 |

OTHER PUBLICATIONS

Office Action dated Jan. 4, 2023, in corresponding Chinese Application No. 202080036876.5, 11 pages.

* cited by examiner

*Primary Examiner* — Thanh Nhan P Nguyen
(74) *Attorney, Agent, or Firm* — Maier & Maier, PLLC

(57) ABSTRACT

According to one embodiment, a display device includes a first substrate, a second substrate, a through hole, and a facing area. The facing area includes a display area and a frame area. The second substrate includes a light-shielding layer and a colored layer. The light-shielding layer includes a first groove formed in a closed annular shape along the through hole and penetrating from the first substrate toward the second substrate. The colored layer is located in the first groove and is provided in an entire area of the first groove in a planar view.

9 Claims, 12 Drawing Sheets

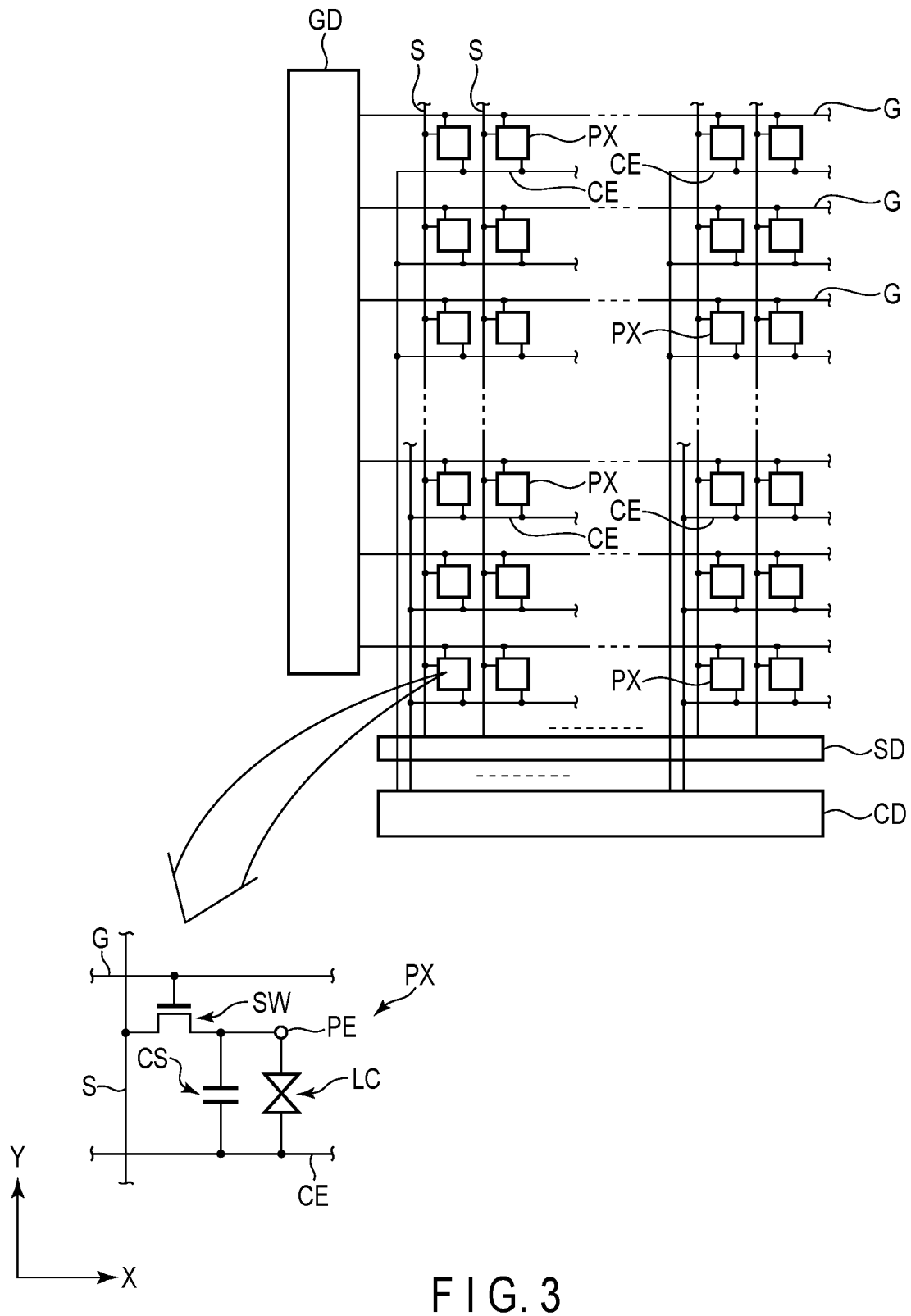
F I G. 3

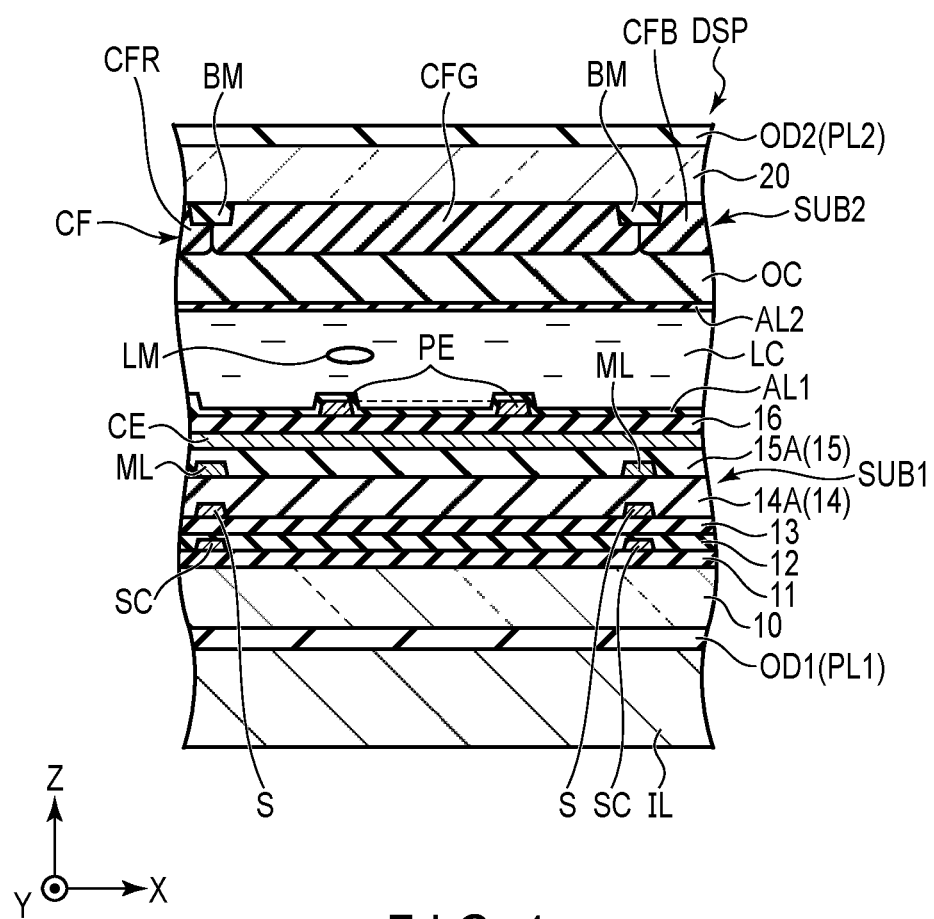
F I G. 4

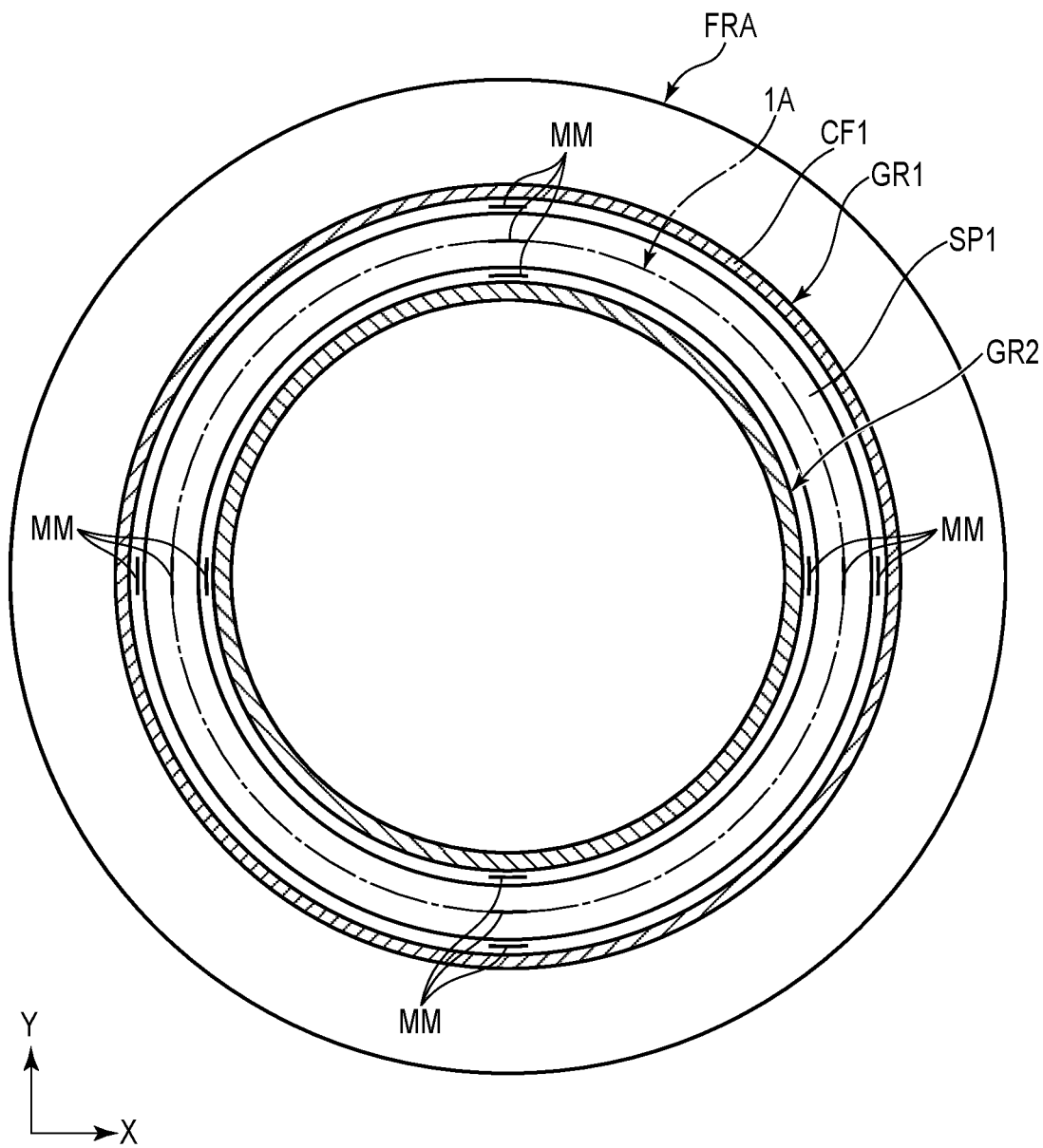
F I G. 9

DISPLAY DEVICE AND DISPLAY PANEL

CROSS-REFERENCE TO RELATED APPLICATIONS

This application is a Continuation Application of PCT Application No. PCT/JP2020/020416, filed May 22, 2020 and based upon and claiming the benefit of priority from Japanese Patent Application No. 2019-096932, filed May 23, 2019, the entire contents of all of which are incorporated herein by reference.

FIELD

Embodiments described herein relate generally to a display device and a display panel.

BACKGROUND

In recent years, display devices having various shapes have been proposed. In one example, a liquid crystal display device having a light shielding portion between a video display portion and a transparent display portion is disclosed. In another example, a liquid crystal display device having a display portion and a transparent portion overlapping a camera is disclosed.

BRIEF DESCRIPTION OF THE DRAWINGS

FIG. 3 is a diagram illustrating a basic configuration and an equivalent circuit of pixels illustrated in FIG. 2.

FIG. 4 is a sectional view illustrating a configuration example of the display device illustrated in FIG. 2.

FIG. 9 is a diagram for describing a method for manufacturing the display device, and is a plan view illustrating a frame area of the display panel before the through hole is provided.

DETAILED DESCRIPTION

Figure 1:
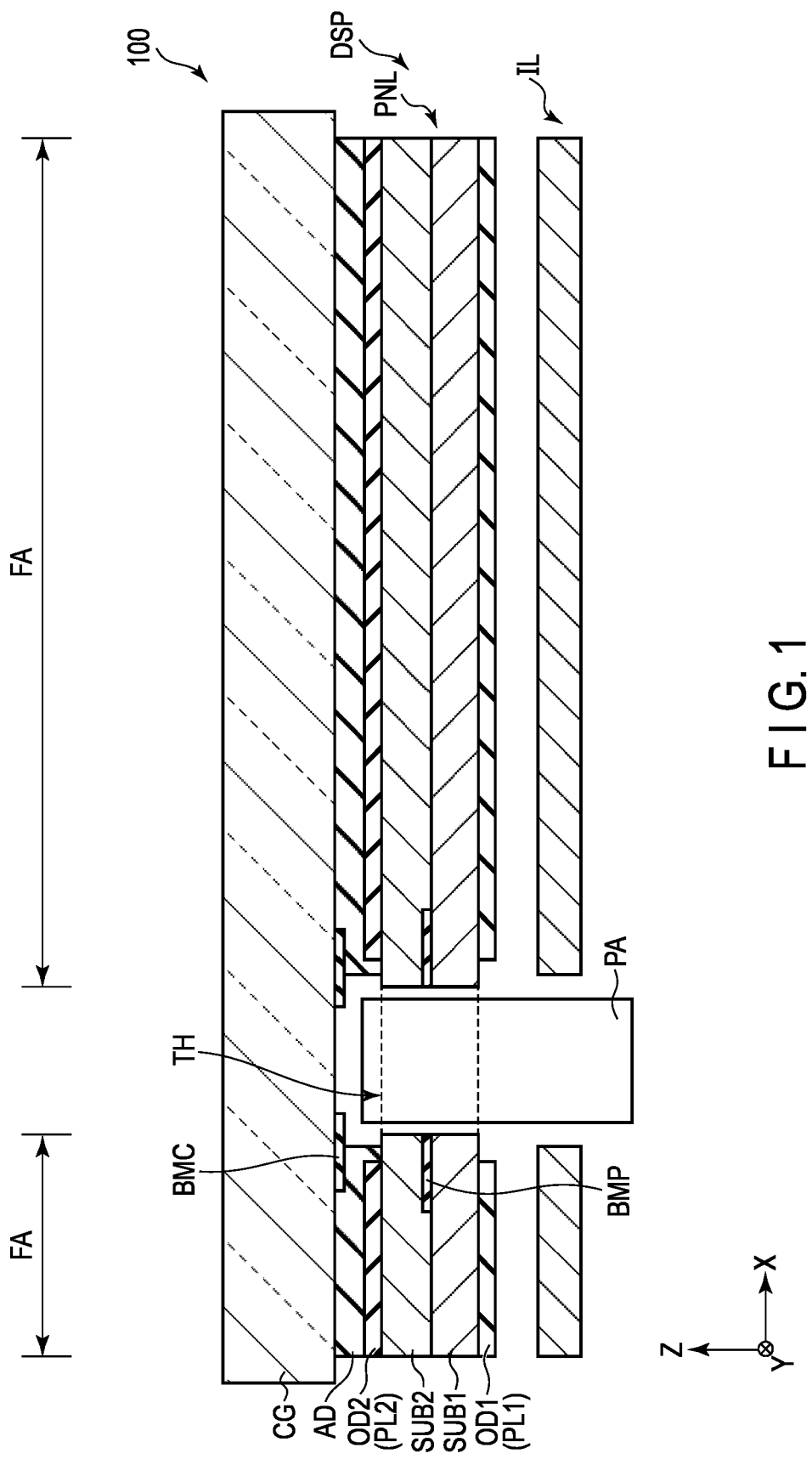
FIG. 1 is a sectional view of an electronic apparatus according to an embodiment.

In general, according to one embodiment, there is provided a display device comprising: a first substrate; a second substrate; a through hole that penetrates the first substrate and the second substrate; and a facing area in which the first substrate and the second substrate face to each other. The facing area includes a display area that is located outside the through hole in a planar view and displays an image, and a frame-shaped frame area that is located between the through hole and the display area and surrounds the through hole. The second substrate includes a light-shielding layer and a colored layer located in the frame area. The light-shielding layer includes a first groove formed in a closed annular shape along the through hole and penetrating from the first substrate toward the second substrate. The colored layer is located in the first groove and is provided in an entire area of the first groove in a planar view.

According to another embodiment, there is provided a display panel comprising: a first substrate; a second substrate; and a facing area in which the first substrate and the second substrate face each other. The facing area includes a display area for displaying an image, a hole-processing area located inside the display area in a planar view, and a frame-shaped frame area located between the display area and the hole-processing area and surrounding the hole-processing area. The second substrate includes: a light-shielding layer including a first groove located in the frame area and a second groove located in the hole-processing area and separated from the first groove; and a colored layer. The first groove is formed in a closed annular shape along the hole-processing area. The second groove is formed in an annular shape along the first groove. The colored layer is located in the first groove and is provided in an entire area of the first groove in a planar view.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a sectional view showing an electronic apparatus 100 according to one embodiment. In this embodiment, a first direction X, a second direction Y and a third direction Z are orthogonal to each other, but they may intersect at an angle other than 90 degrees. In the following descriptions, a direction forwarding a tip of an arrow indicating the third direction Z is referred to as "upward" and a direction forwarding oppositely from the tip of the arrow is referred to as "downward". Further, viewing from above downward onto an X-Y plane defined by the first direction X and the second direction Y is referred to as planar view.

As illustrated in FIG. 1, the electronic apparatus 100 includes a display device DSP, an illumination device IL, and a photoreceiver PA.

The display device DSP may be, for example, a display device that requires a light source independent of a display panel PNL such as a liquid crystal display device, a self-luminous display device such as an organic electro luminescence (EL) display device or a micro light emitting diode (LED), or may be an electrophoretic display device. In the following embodiments, a liquid crystal display device will be described as an example.

The display device DSP includes a transparent substrate CG and a display panel PNL.

The display panel PNL includes a first substrate SUB1, a second substrate SUB2, an optical element OD1, and an optical element OD2. The display panel PNL has a through hole TH and a facing area FA. The through hole TH is a through hole penetrating each of the first substrate SUB1 and the second substrate SUB2 in a third direction Z. In the example illustrated, the through hole TH penetrates each of the optical element OD1, the first substrate SUB1, a light-shielding layer BMP, the second substrate SUB2, and the optical element OD2. The facing area FA is an area where the first substrate SUB1 and the second substrate SUB2 face each other.

The second substrate SUB2 includes the light-shielding layer BMP. The light-shielding layer BMP is located between the first substrate SUB1 and the second substrate SUB2. The optical element OD1 including a polarizer PL1 is bonded to the first substrate SUB1. The optical element OD2 including a polarizer PL2 is bonded to the second substrate SUB2. Note that the optical elements OD1 and OD2 may include a retardation film, a scattering layer, an antireflective layer, and the like as needed.

The transparent substrate CG is bonded to the display panel PNL by a transparent adhesive layer AD. The transparent substrate CG includes a light-shielding layer BMC. In the example illustrated, the light-shielding layer BMC is provided on a lower surface of the transparent substrate CG and overlaps the light-shielding layer BMP in the third direction Z. The transparent substrate CG is a glass substrate, a flexible resin substrate, or the like.

The illumination device IL illuminates the display panel PNL. In the example illustrated, the illumination device IL has a through hole overlapping the through hole TH in the third direction Z.

The photoreceiver PA is, for example, a camera. Note that, for example, the photoreceiver PA may be a photoreceiver that detects visible light, a photoreceiver that detects infrared light, a proximity sensor that senses an approach of a detection target, a detection element that detects infrared light reflected from the detection target, or a combination thereof. The photoreceiver PA is provided in the through hole TH in the third direction Z, and is covered with the transparent substrate CG. The photoreceiver PA receives light through the transparent substrate CG.

Figure 2:
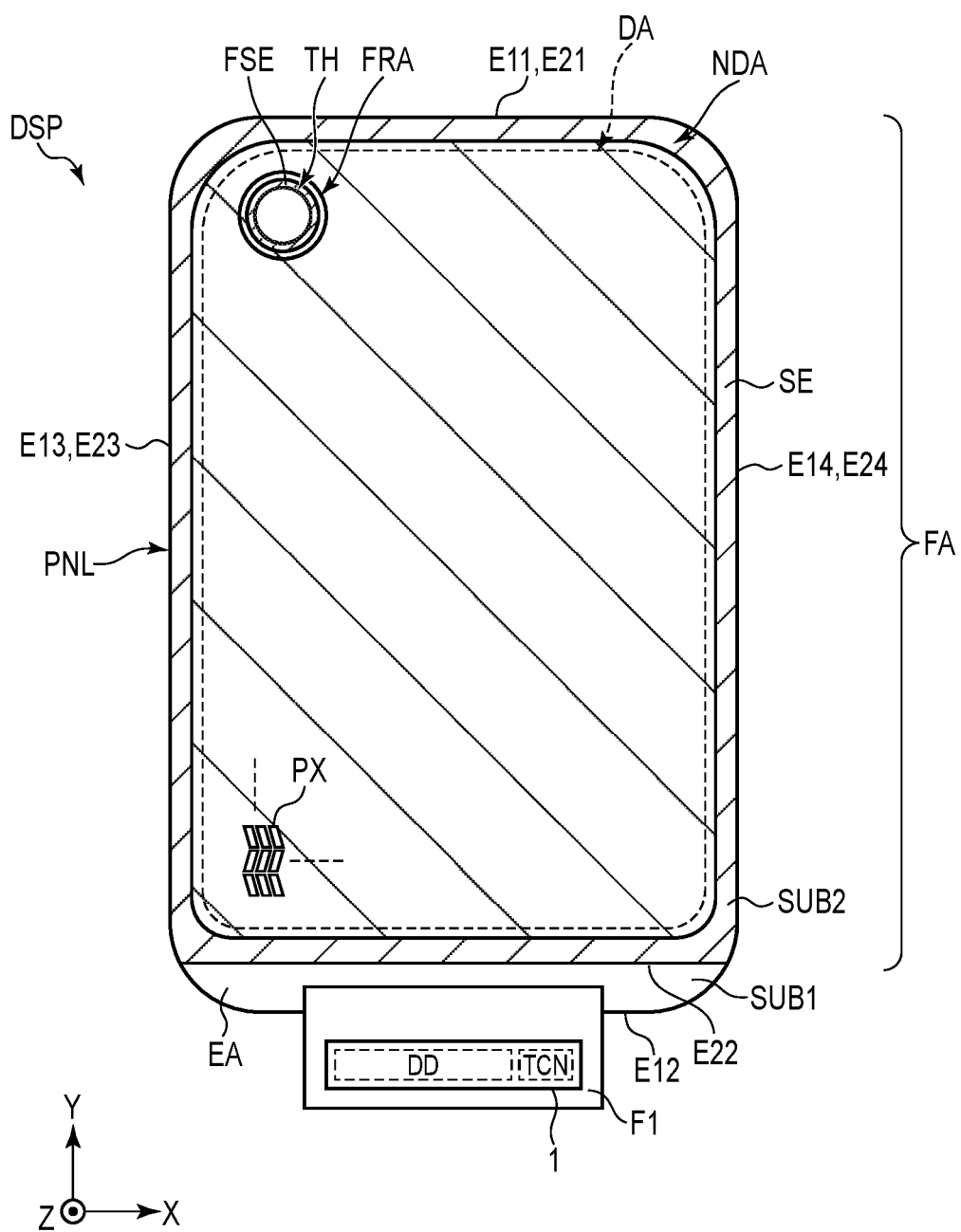
FIG. 2 is a plan view of the display device illustrated in FIG. 1.

FIG. 2 is a plan view of the display device DSP illustrated in FIG. 1.

As illustrated in FIG. 2, the display device DSP further includes a wiring substrate F1 and an IC chip 1.

The first substrate SUB1 has an extended area EA aligned with the facing area FA in a second direction Y. The second substrate SUB2 overlaps the facing area FA and does not overlap the extended area EA in a planar view. The facing area FA can also be referred to as two layer portions of the display panel PNL in which the first substrate SUB1 and the second substrate SUB2 overlap each other. The extended area EA can also be referred to as one layer portion of the display panel PNL in which the first substrate SUB1 is exposed from the second substrate SUB2.

The first substrate SUB1 has edge portions E11 and E12 extending in the first direction X, and edge portions E13 and E14 extending in the second direction Y. The second substrate SUB2 has edge portions E21 and E22 extending in the first direction X and edge portions E23 and E24 extending in the second direction Y. The edge portion E22 corresponds to a substrate edge along a boundary between the facing area FA and the extended area EA. That is, the facing area FA corresponds to an area surrounded by the edge portion E11, the edge portion E22, the edge portion E13, and the edge portion E14 in a planar view. The extended area EA corresponds to an area between the edge portion E12 and the edge portion E22 in a planar view.

The facing area FA includes a display area DA for displaying an image, a frame-shaped non-display area NDA surrounding the display area DA, and a frame area FRA. The display area DA is located outside the through hole TH in a planar view. The frame area FRA has a frame shape that is located between the through hole TH and the display area DA and surrounds the through hole TH in a planar view. The frame area FRA has a closed annular shape adjacent to an outer side of the through hole TH. In the example illustrated, the through hole TH is a perfect circle, but may be another circle such as an ellipse or a polygon other than a circle.

The display area DA includes a plurality of pixels PX disposed in a matrix in the first direction (column direction) X and the second direction (row direction) Y. Here, a pixel PX indicates a minimum unit that can be individually controlled according to a pixel signal, and may be referred to as a sub-pixel. The pixel PX is, for example, any of a red pixel exhibiting red, a green pixel exhibiting green, a blue pixel exhibiting blue, and a white pixel exhibiting white.

The non-display area NDA corresponds to an outside of the display area DA and the extended area EA in the facing area FA. The IC chip 1 and the wiring substrate F1 may read a signal from the display panel PNL, but mainly function as a signal source that supplies a signal to the display panel PNL. The IC chip 1 is mounted on the wiring substrate F1 and electrically connected to the wiring substrate F1. Note that the IC chip 1 may be mounted in the extended area EA and electrically connected to the extended area EA. The IC chip 1 incorporates a display driver DD that outputs a signal necessary for image display in an image display mode for displaying an image. In addition, in the example illustrated, the IC chip 1 incorporates a touch controller TCN that controls a touch sensing mode for detecting an approach or a contact of an object on the display device DSP. In the figure, the display driver DD and the touch controller TCN are illustrated by dashed lines. The wiring substrate F1 is a bendable flexible printed circuit.

The display panel PNL further includes a liquid crystal layer LC, a sealant SE, and a sealant FSE. The sealant SE is located in the non-display area NDA, and the sealant FSE is located in the frame area FRA. The first substrate SUB1 and the second substrate SUB2 are bonded by the sealants SE and FSE. The liquid crystal layer LC is held between the first substrate SUB1 and the second substrate SUB2, and is sealed by the sealants SE and FSE. The liquid crystal layer LC is provided over each of the frame area FRA and the display area DA. In FIG. 2, the sealants SE and FSE are indicated by upward-sloping hatch lines, and the liquid crystal layer LC is indicated by downward-sloping hatch lines.

The display panel PNL of the present embodiment may be a transmissive display panel PNL having a transmissive display function of selectively transmitting light from a back surface side of the first substrate SUB1 to display an image, a reflective display panel PNL having a reflective display function of selectively reflecting light from a front surface side of the second substrate SUB2 to display an image, or a transreflective display panel PNL having both the transmissive display function and the reflective display function.

Although the detailed configuration of the display panel PNL will not be described here, the display panel PNL may have any configuration corresponding to a display mode using a lateral electric field along a main surface of the substrate, a display mode using a longitudinal electric field along a normal line of the main surface of the substrate, a display mode using an inclined electric field inclined in an oblique direction with respect to the main surface of the substrate, or a display mode using an appropriate combination of the lateral electric field, the longitudinal electric field, and the inclined electric field. Here, the main surface of the substrate is a surface parallel to the X-Y plane defined by the first direction X and the second direction Y.

FIG. 3 is a diagram illustrating a basic configuration and an equivalent circuit of the pixels PX illustrated in FIG. 2.

As illustrated in FIG. 3, a plurality of scanning lines G are connected to a scanning line driving circuit GD, and a plurality of signal lines S are connected to a signal line driving circuit SD. Each of the scanning lines G and each of the signal lines S are formed of a metal material such as aluminum (Al), titanium (Ti), silver (Ag), molybdenum (Mo), tungsten (W), copper (Cu), or chromium (Cr), or an alloy obtained by combining these metal materials. Each of the scanning lines G and the signal lines S may have a single-layer structure or a multilayer structure. Note that the scanning lines G and the signal lines S do not necessarily extend linearly, and some of them may be bent.

A common electrode CE is disposed over the plurality of pixels PX. The common electrode CE is connected to a voltage supply unit CD, and the touch controller TCN illustrated in FIG. 2. In the image display mode, the voltage supply unit CD supplies a common voltage (Vcom) to the common electrode CE. In the touch sensing mode, the touch controller TCN supplies a touch driving voltage different from the common voltage to the common electrode CE.

Each of the pixels PX includes a switching element SW, a pixel electrode PE, a common electrode CE, a liquid crystal layer LC, and the like. The switching element SW includes, for example, a thin film transistor (TFT), and is electrically connected to a scanning line G and a signal line S. The scanning line G is electrically connected to the switching element SW in each of the pixels PX arranged in the first direction X. The signal line S is electrically connected to the switching element SW in each of the pixels PX arranged in the second direction Y. A control signal for controlling the switching element SW is supplied to the scanning line G. A video signal is supplied to the signal line S as a signal different from the control signal. The pixel electrode PE is electrically connected to the switching element SW. The liquid crystal layer LC is driven by an electric field generated between the pixel electrodes PE and the common electrode CE. A capacitance CS is formed, for example, between an electrode having a same electric potential as that of the common electrode CE and an electrode having a same electric potential as that of the pixel electrode PE.

FIG. 4 is a sectional view illustrating a configuration example of the display device DSP illustrated in FIG. 2. The example illustrated corresponds to an example in which a fringe field switching (FFS) mode, which is one of display modes using a lateral electric field, is applied.

As illustrated in FIG. 4, the first substrate SUB1 includes an insulating substrate 10, an insulating layers 11 to 16, a semiconductor layer SC, signal lines S, metal lines ML, a common electrode CE, pixel electrodes PE, an alignment film AL1, and the like. The insulating substrate 10 is a transparent substrate such as a glass substrate or a flexible resin substrate. The insulating layer 11 is located on the insulating substrate 10. The semiconductor layer SC is located on the insulating layer 11 and covered with the insulating layer 12. The semiconductor layer SC is formed of, for example, polycrystalline silicon, but may be formed of amorphous silicon or an oxide semiconductor. The insulating layer 12 is covered with the insulating layer 13. The scanning lines G illustrated in FIG. 3 are located between the insulating layers 12 and 13. The insulating layer 14 includes a first portion 14A. The insulating layer 15 includes a third portion 15A. The signal lines S are located on the insulating layer 13 and covered with the first portion 14A. The metal lines ML are located on the first portion 14A and covered by the third portion 15A. The metal lines ML are formed of, for example, a metal material such as aluminum (Al), titanium (Ti), silver (Ag), molybdenum (Mo), tungsten (W), copper (Cu), or chromium (Cr), or an alloy obtained by combining these metal materials. The metal lines ML may have a single-layer structure or a multilayer structure. Each of the metal lines ML extends in parallel with each signal line S and is located immediately above the signal line S.

The common electrode CE is located on the third portion 15A and covered with the insulating layer 16. The pixel electrodes PE are located on the insulating layer 16 and covered with the alignment film AL1. Each of the pixel electrodes PE faces the common electrode CE through the insulating layer 16. The common electrode CE and the pixel electrodes PE are formed of, for example, a transparent conductive material such as indium tin oxide (ITO) or indium zinc oxide (IZO). The pixel electrodes PE are linear electrodes, and the common electrode CE is plate-like electrode commonly provided over the plurality of pixels PX. The pixel electrodes PE may be plate-like electrodes, and a linear common electrode may be provided between each of the pixel electrodes PE and the liquid crystal layer LC.

The insulating layer 11, the insulating layer 12, and the insulating layers 13 and 16 are inorganic insulating layers formed of an inorganic insulating material such as silicon oxide (SiO), silicon nitride (SiN), or silicon oxynitride (SiON). The insulating layer 16 is formed of, for example, SiN. The insulating layer 11, the insulating layer 12, and the insulating layers 13 and 16 may have a single-layer structure or a multilayer structure. The insulating layers 14 and 15 are, for example, organic insulating layers formed of an organic insulating material such as an acrylic resin.

The second substrate SUB2 includes an insulating substrate 20, a colored layer CF, a light-shielding layers BM, a transparent layer OC, and an alignment film AL2. The insulating substrate 20 is a transparent substrate such as a glass substrate or a flexible resin substrate. The colored layer CF, the light-shielding layers BM, and the transparent layer OC are located between the insulating substrate 20 and the liquid crystal layer LC. The alignment film AL2 is in contact with the liquid crystal layer LC. The alignment films AL1 and AL2 are formed of, for example, a material having a horizontal alignment property. The transparent layer OC covers the colored layer CF and the light-shielding layers BM. The transparent layer OC is, for example, a transparent organic insulating layer. In the example illustrated, the colored layer CF is provided in the second substrate SUB2, but may be provided in the first substrate SUB1. The colored layer CF includes red layers CFR, green layers CFG, and blue layers CFB. The green layer CFG faces the pixel electrode PE. Each of the red layer CFR and the blue layer CFB also faces other pixel electrodes PE (not illustrated).

The liquid crystal layer LC is held between the first substrate SUB1 and the second substrate SUB2, and is held between the alignment film AL1 and the alignment film AL2. The liquid crystal layer LC includes liquid crystal molecules LM. The liquid crystal layer LC is made of a positive type (positive dielectric anisotropy) liquid crystal material or a negative type (negative dielectric anisotropy) liquid crystal material.

In such a display panel PNL, in an off state in which no electric field is formed between the pixel electrodes PE and the common electrode CE, the liquid crystal molecules LM are initially aligned in a predetermined direction between the alignment films AL1 and AL2. In such an off state, an illumination light emitted from the illumination device IL toward the display panel PNL is absorbed by the optical elements OD1 and OD2 and provides dark display. On the other hand, in an ON state in which an electric field is formed between the pixel electrodes PE and the common electrode CE, the liquid crystal molecules LM are aligned in a direction different from the initial alignment direction by the electric field, and the alignment direction is controlled by the electric field. In such an ON state, a part of the illumination light from the illumination device IL is transmitted through the optical elements OD1 and OD2 and provides bright display.

Next, an arrangement of the signal lines S and the metal lines ML around the through hole TH will be described with reference to FIGS. 5 and 6.

Figure 5:
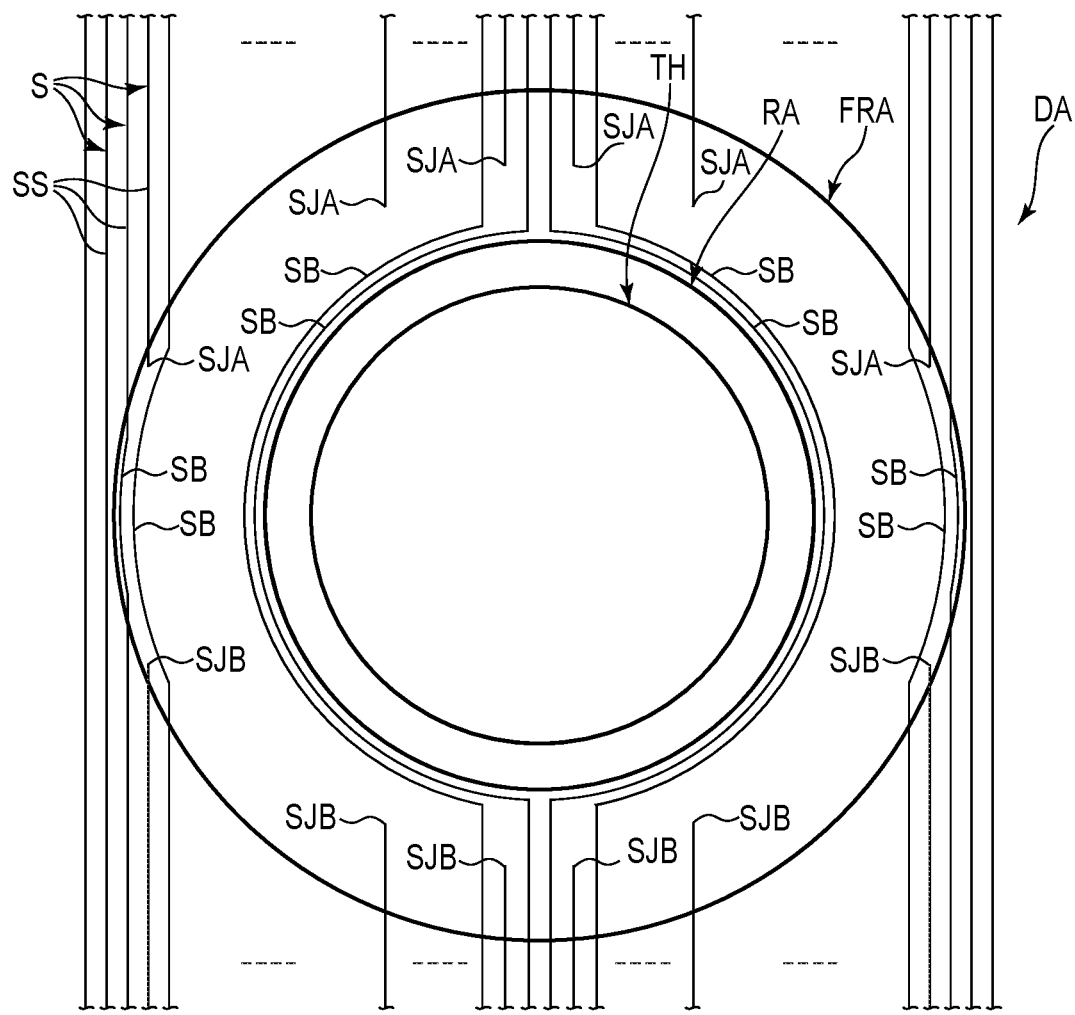
FIG. 5 is an enlarged plan view of signal lines around a through hole illustrated in FIG. 2.

FIG. 5 is an enlarged plan view of the signal lines S around the through hole TH illustrated in FIG. 2.

As illustrated in FIG. 5, the frame area FRA includes a temporary area RA. The temporary area RA is located outside the through hole TH. The temporary area RA is a closed annular area adjacent to the through hole TH. For example, the temporary area RA is an area provided in consideration of an error in manufacturing when the through hole TH is provided in the display panel PNL. Therefore, the scanning lines G, the signal lines S, and the metal lines ML are not provided in the temporary area RA.

The plurality of signal lines S include a straight portion SS, a bypass portion SB, an end portion SJA, and an end portion SJB. The straight portion SS is a portion extending in the second direction Y. The bypass portion SB is a portion bypassing so as to avoid the through hole TH in the frame area FRA. In the example illustrated, the bypass portion SB extends in an arc shape along an outer periphery of the through hole TH in a planar view. The end portions SJA and SJB are end portions of the signal lines S located in the frame area FRA. In the example illustrated, the end portion SJA and the end portion SJB are located on a same straight line parallel to the second direction Y.

Among the plurality of signal lines S, the signal lines S located only in the display area DA has a straight portion SS. Among the plurality of signal lines S, a part of the signal lines S extending to the frame area FRA include a straight portion SS and a bypass portion SB. Among the plurality of signal lines S, a part of the signal lines S extending to the frame area FRA has a straight portion SS and an end portion SJA or SJB.

Figure 6:
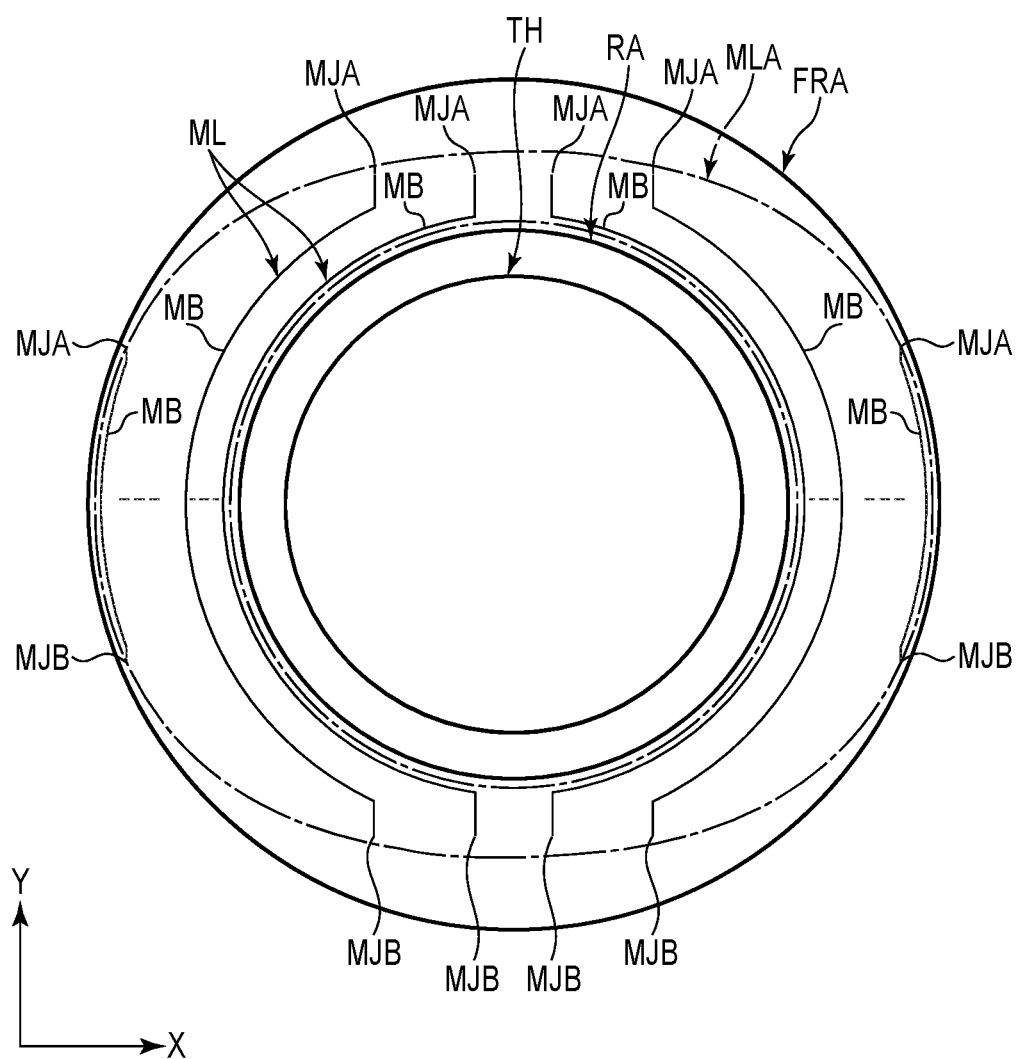
FIG. 6 is an enlarged plan view of metal lines around the through hole illustrated in FIG. 2.

FIG. 6 is an enlarged plan view of the metal lines ML around the through hole TH illustrated in FIG. 5. In FIG. 6, only the metal lines ML located in the frame area FRA among the plurality of metal lines ML are illustrated.

As illustrated in FIG. 6, the frame area FRA includes an area MLA. The area MLA is an area surrounded by an alternate long and short dash line. The area MLA is an area where the metal lines ML are provided in the frame area FRA. The area MLA is a closed annular area adjacent to an outer side of the temporary area RA.

The plurality of metal lines ML includes a bypass portion MB, an end portion MJA, and an end portion MJB. The bypass portion MB is a portion bypassing so as to avoid the through hole TH. In the example illustrated, the bypass portion MB extends in an arc shape along the outer periphery of the through hole TH in a planar view. The end portion MJA and the end portion MJB are located on the same straight line parallel to the second direction Y. The end portion MJA is connected to the end portion SJA illustrated in FIG. 5 through, for example, a contact hole. Similarly, the end portion MJB is connected to the end portion SJB illustrated in FIG. 5.

When the through hole TH is provided in an area surrounded by the display area DA as in the present embodiment, the wiring lines provided around the through hole TH (frame area FRA) need to be disposed while bypassing the through hole TH. In the present embodiment, a part of each of the plurality of signal lines S can be transferred to the metal line ML formed in different layer. Therefore, as compared with a case where the signal lines S bypass the through hole TH without transferring a part of the signal line S to the metal line ML, the number of signal lines S formed in a same layer among the signal lines S bypassing the through hole TH can be reduced. Accordingly, an enlargement of the frame area FRA can be suppressed, and the display area DA can be prevented from being narrowed.

Figure 7:
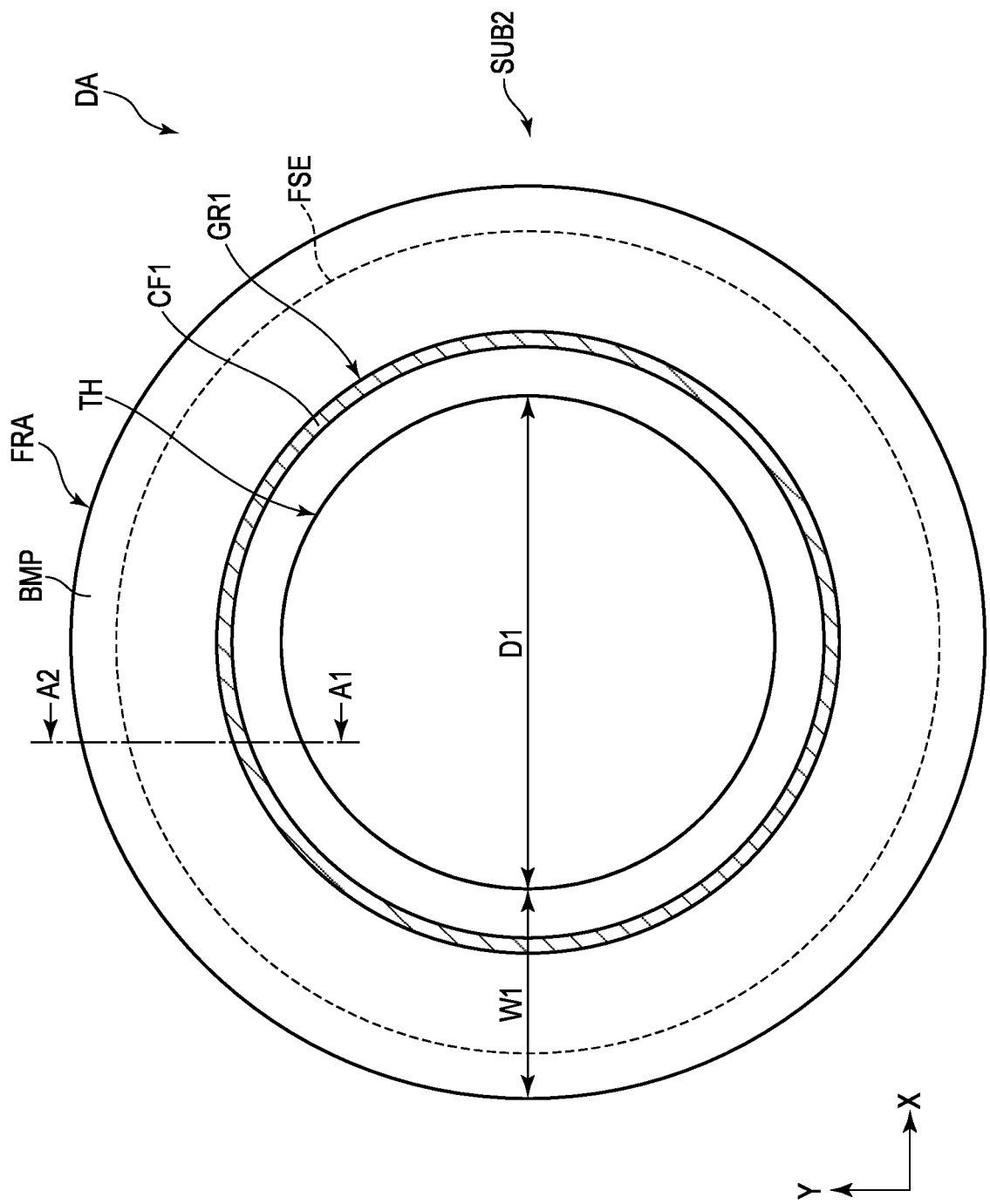
FIG. 7 is an enlarged plan view of a second substrate around the through hole illustrated in FIG. 2.

FIG. 7 is an enlarged plan view of the second substrate SUB2 around the through hole TH illustrated in FIG. 2.

As illustrated in FIG. 7, the second substrate SUB2 includes the light-shielding layer BMP and a colored layer CF1.

The light-shielding layer BMP is provided in the entire frame area FRA. In other words, the frame area FRA corresponds to an area where the light-shielding layer BMP is provided. The light-shielding layer BMP has a groove GR1. The groove GR1 is formed in a closed annular shape along the through hole TH. As will be described in detail with reference to FIG. 8, the groove GR1 is formed to penetrate the light-shielding layer BMP.

The colored layer CF1 is located in the groove GR1, and is provided over the entire groove GR1 in the planar view. In FIG. 7, the colored layer CF1 is indicated by oblique lines.

A diameter D1 of the through hole TH is approximately 3 mm to 5 mm. The light-shielding layer BMP has a width W1. As an example, the width W1 is a length in a direction from a central axis of the through hole TH toward the display area DA in the planar view, and is approximately 0.7 mm to 1 mm.

Figure 8:
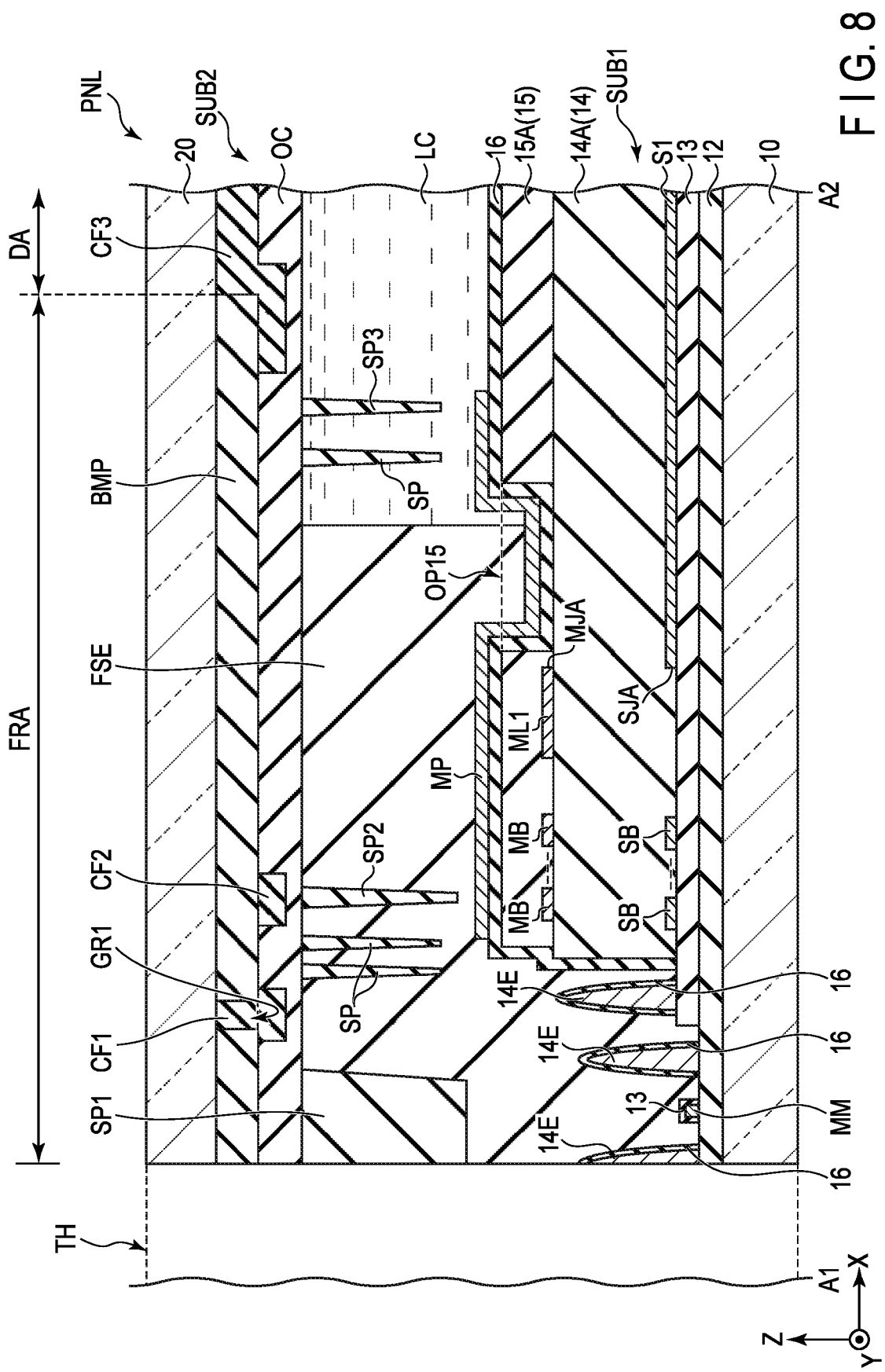
FIG. 8 is a sectional view of the display panel taken along line A1-A2 in FIG. 7.

FIG. 8 is a sectional view of the display panel PNL taken along line A1-A2 illustrated in FIG. 7. In FIG. 8, illustration of the alignment films AL1 and AL2 is omitted.

As illustrated in FIG. 8, the first substrate SUB1 further includes a metal line MM, a transparent conductive layer MP, a signal line S1, and a metal line ML1.

The insulating layer 14 includes a first portion 14A provided over the frame area FRA and the display area DA, and a plurality of protrusions 14E. The plurality of protrusions 14E are located between the first portion 14A and the through hole TH, and are arranged at intervals in a direction from the through hole TH toward the display area DA. Each of the protrusions 14E is formed in a shape tapered toward the second substrate SUB2, and covered with the insulating layer 16. Therefore, even if the alignment film AL1 is applied to the first substrate SUB1 at a time of manufacturing, the alignment film AL1 does not remain in an area located immediately above an upper end of the protrusions 14E, and thus the insulating layer 16 is exposed from the alignment film AL1. When the first substrate SUB1 and second substrate SUB2 are bonded to each other, the insulating layer 16 located at an upper end of protrusions 14E directly adheres to the sealant SE. Therefore, the display device DSP can form an area that can be bonded with sufficient bonding strength.

The metal lines MM are located on the insulating layer 12 and covered with the insulating layer 13. The metal lines MM are formed of, for example, a same material as the scanning lines G. In the example illustrated, each of the metal lines MM is located between the adjacent protrusions 14E. Note that the protrusion 14E may be provided immediately above the metal lines MM.

The signal line S1 have an end portion SJA. The signal line S1 and the plurality of bypass portions SB each are located on the insulating layer 13 and covered with the first portion 14A. The signal line S1 and the plurality of bypass portions SB are separated from each other.

The third portion 15A is provided over the frame area FRA and the display area DA. The metal line ML1 has an end portion MJA. The metal line ML1 and a plurality of the bypass portions MB are located on the first portion 14A and covered by the third portion 15A. The metal line ML1 and the plurality of the bypass portions MB are separated from each other. Each of the bypass portions MB is located above the bypass portion SB. The signal line S1 and the metal line ML1 are connected through a contact hole (not illustrated).

The third portion 15A has an opening OP15. The opening OP15 is a through hole penetrating in the third direction Z. The opening OP15 is provided at a position not overlapping each of the plurality of the bypass portions MB and the metal line ML1. The opening OP15 is provided in an area excluding the area MLA in the frame area FRA (FIG. 6).

The transparent conductive layer MP is located in the frame area FRA and is formed on the insulating layer 16. The transparent conductive layer MP is formed of, for example, a same material as the pixel electrodes PE, and is disposed in a floating state.

The second substrate SUB2 further includes a colored layer CF2, a colored layer CF3, and spacers SP (SP1, SP2, . . . ).

The light-shielding layer BMP is located between the insulating substrate 20 and the transparent layer OC. Since the light-shielding layer BMP has the groove GR1, it is possible to prevent moisture from entering the light-shielding layer BMP from the through hole TH and moisture from entering the display area DA through the light-shielding layer BMP. In addition, a transfer of charges to the display area DA through the light-shielding layer BMP can be blocked. Accordingly, in a manufacturing process of the display panel PNL, it is possible to suppress concentration of static electricity on the display area DA and to suppress damage to the display panel PNL.

The colored layer CF1 is filled in the groove GR1 and covers an end portion of the groove GR1 of the light-shielding layer BMP. Thus, light leakage from the groove GR1 is suppressed. The colored layer CF1 is blue, for example. The colored layer CF2 is located between the light-shielding layer BMP and the transparent layer OC. The colored layer CF3 is located between the light-shielding layer BMP and the transparent layer OC in the frame area FRA, and is located between the insulating substrate 20 and the transparent layer OC in the display area DA. In the example illustrated, the colored layer CF3 covers an end portion of the light-shielding layer BMP on the display area DA.

For example, the spacers SP are disposed on a lower surface of the transparent layer OC, and protrude toward the first substrate SUB1. The spacers SP are formed of a resin material. A spacer SP1 is located along a circumferential direction of the through hole TH. A spacer SP2 is provided at a position overlapping each of the colored layer CF2, the transparent layer OC, the first portion 14A, and the third portion 15A. A spacer SP3 is provided at a position overlapping each of the transparent layer OC, the first portion 14A, and the third portion 15A. As a result, the spacers SP2 and SP3 maintain a cell gap to each other and suppress a spread of the sealant FSE to the display area DA.

The sealant FSE is located in the frame area FRA and extends between the spacer SP3 and the through hole TH. The liquid crystal layer LC is in contact with the sealant FSE in the frame area FRA.

According to the present embodiment, the third portion 15A of the insulating layer 15 has the opening OP15 at a position not overlapping the metal lines ML. As a result, even if an amount of a sealing material applied by a dispenser varies, since the excessive amount of the sealing material is absorbed by the opening OP15, it is possible to suppress the spread of the sealant FSE to the display area DA.

In the present embodiment, the groove GR1 corresponds to a first groove, the insulating layer 14 corresponds to a first organic insulating layer, the insulating layer 15 corresponds to a second organic insulating layer, and the metal line ML corresponds to a first metal line.

Next, a method for manufacturing the display device DSP will be described.

FIG. 9 is a diagram for describing the method for manufacturing the display device DSP, and is a plan view illustrating the frame area FRA of the display panel PNL before the through hole TH is provided.

As illustrated in FIG. 9, when the manufacturing of the display panel PNL is started, the display panel PNL having a first area 1A corresponding to the through hole TH illustrated in FIG. 7 is prepared. The first area 1A is located inside the display area DA in the planar view. The frame area FRA is located between the display area DA and the first area 1A, and has a frame shape surrounding the first area 1A. The first area 1A may be referred to as a hole-processing area or a predetermined through-hole forming area.

The light-shielding layer BMP is also provided over the entire first area 1A in a planar view. The light-shielding layer BMP includes the groove GR1 located in the frame area FRA and a groove GR2 located in the first area 1A. The groove GR1 is formed in a closed annular shape along the first area 1A. The groove GR2 is formed in an annular shape along the groove GR1 and is separated from the groove GR1. The colored layer CF1 is located in the groove GR1, and is provided over the entire groove GR1 in the planar view.

The spacer SP1 is located at a boundary between the frame area FRA and the first area 1A, and is formed in an annular shape. In the example illustrated, the spacer SP1 is located between the groove GR1 and the groove GR2.

The plurality of metal lines MM are disposed at regular intervals in a normal direction of the groove GR2 in a planar view, and are annularly disposed so as to surround the groove GR2. The metal lines MM are located between the groove GR1 and the groove GR2.

Figure 10:
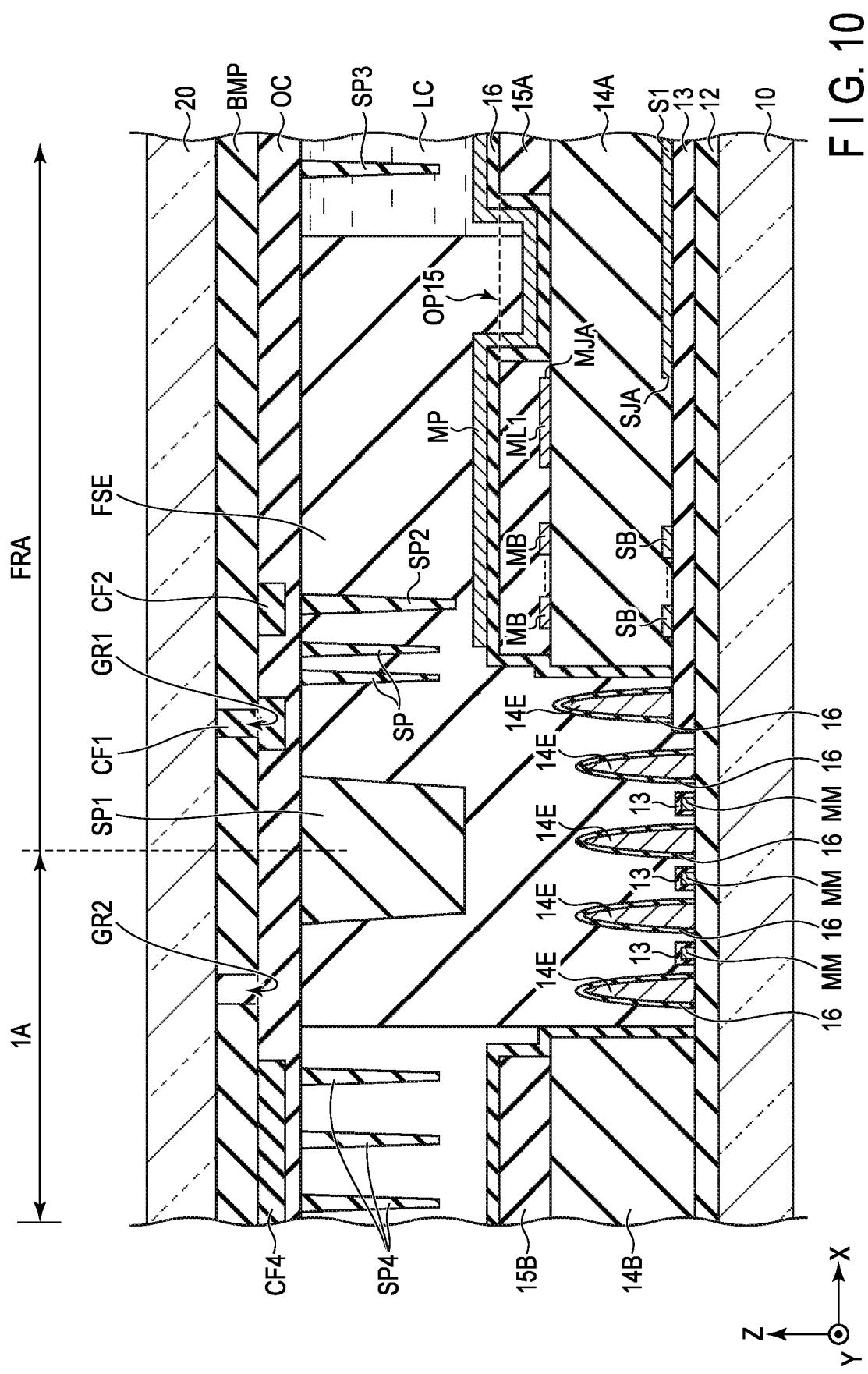
FIG. 10 is a sectional view of the display panel illustrated in FIG. 9.

FIG. 10 is a sectional view of the display panel PNL illustrated in FIG. 9.

As illustrated in FIG. 10, the display panel PNL has a same structure as the frame area FRA illustrated in FIG. 8 in the frame area FRA. The third portion 15A has an opening OP15 at a position not overlapping each of the plurality of the bypass portions MB and the metal line ML1 in the frame area FRA. The liquid crystal layer LC is in contact with the sealant FSE in the frame area FRA. The liquid crystal layer LC is not provided in the first area 1A.

The insulating layer 14 includes a second portion 14B. The second portion 14B is located in the first area 1A and is located on the insulating layer 12. The second portion 14B is located inside the groove GR2 in a planar view. The second portion 14B is separated from the protrusions 14E.

The insulating layer 15 includes a fourth portion 15B. The fourth portion 15B is located on the second portion 14B and covered with the insulating layer 16.

The second substrate SUB2 further includes a plurality of spacers SP4 and a colored layer CF4 in the first area 1A. The groove GR2 of the light-shielding layer BMP is formed to penetrate the light-shielding layer BMP. In the example illustrated, the groove GR2 is filled with the transparent layer OC. The transparent layer OC is in contact with the insulating substrate 20 in the groove GR2.

The colored layer CF4 is located between the light-shielding layer BMP and the transparent layer OC. The colored layer CF4 may not be provided. The plurality of spacers SP4 are located between the light-shielding layer BMP and the fourth portion 15B to maintain a cell gap. In the example illustrated, the spacers SP4 are separated from the first substrate SUB1, but the spacers SP4 may be in contact with the first substrate SUB1.

The spacer SP1 overlaps the plurality of protrusions 14E. This suppresses the spread of the sealant FSE to the display area DA. The sealant FSE also extends to the first area 1A.

Figure 11:
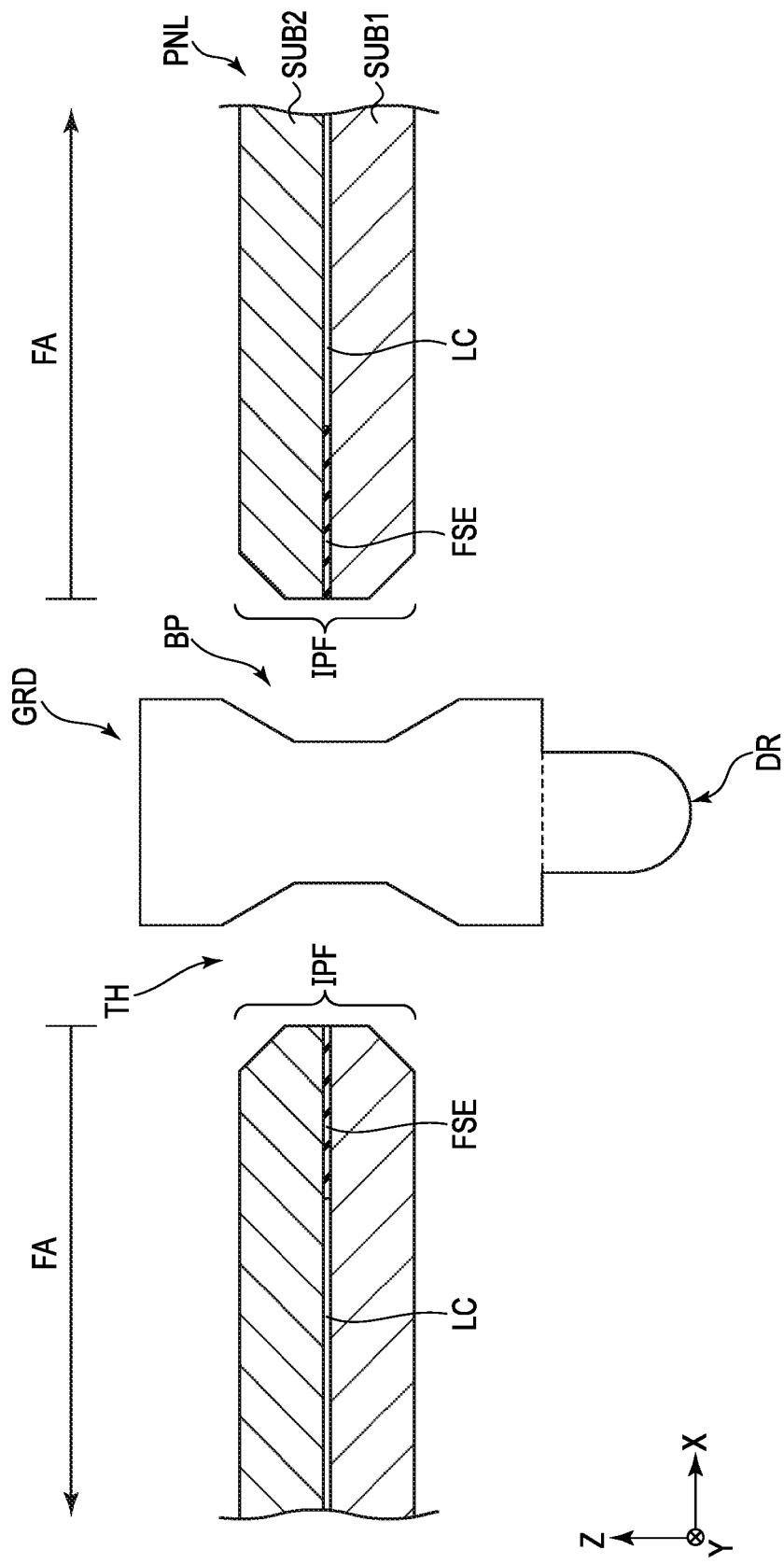
FIG. 11 is a diagram for describing the method for manufacturing the display device, following FIGS. 9 and 10, and is a sectional view illustrating a state in which a hole is being provided in the display panel using a punching machine.

FIG. 11 is a diagram for describing the method for manufacturing the display device DSP, following FIGS. 9 and 10, and is a sectional view illustrating a state in which the through hole TH is provided in the display panel PNL using a punching machine GRD.

As illustrated in FIG. 11, the punching machine GRD includes a punching portion DR and a hole expansion portion BP. Each of the punching portion DR and the hole expansion portion BP is formed of a grindstone. An end portion of the punching portion DR is formed in a hemispherical shape. The hole expansion portion BP has a substantially cylindrical shape, and a side surface of the cylinder is recessed toward a center of the cylinder.

The display panel PNL has a processed surface IPF exposed by the through hole TH. The processed surface IPF is a surface formed along a shape of the hole expansion portion BP. In the example illustrated, the processed surface IPF is formed in a C shape or an inverted C shape. Therefore, it is possible to suppress breakage of the sealant FSE due to an impact during conveyance or handling of the display device DSP.

Figure 12:
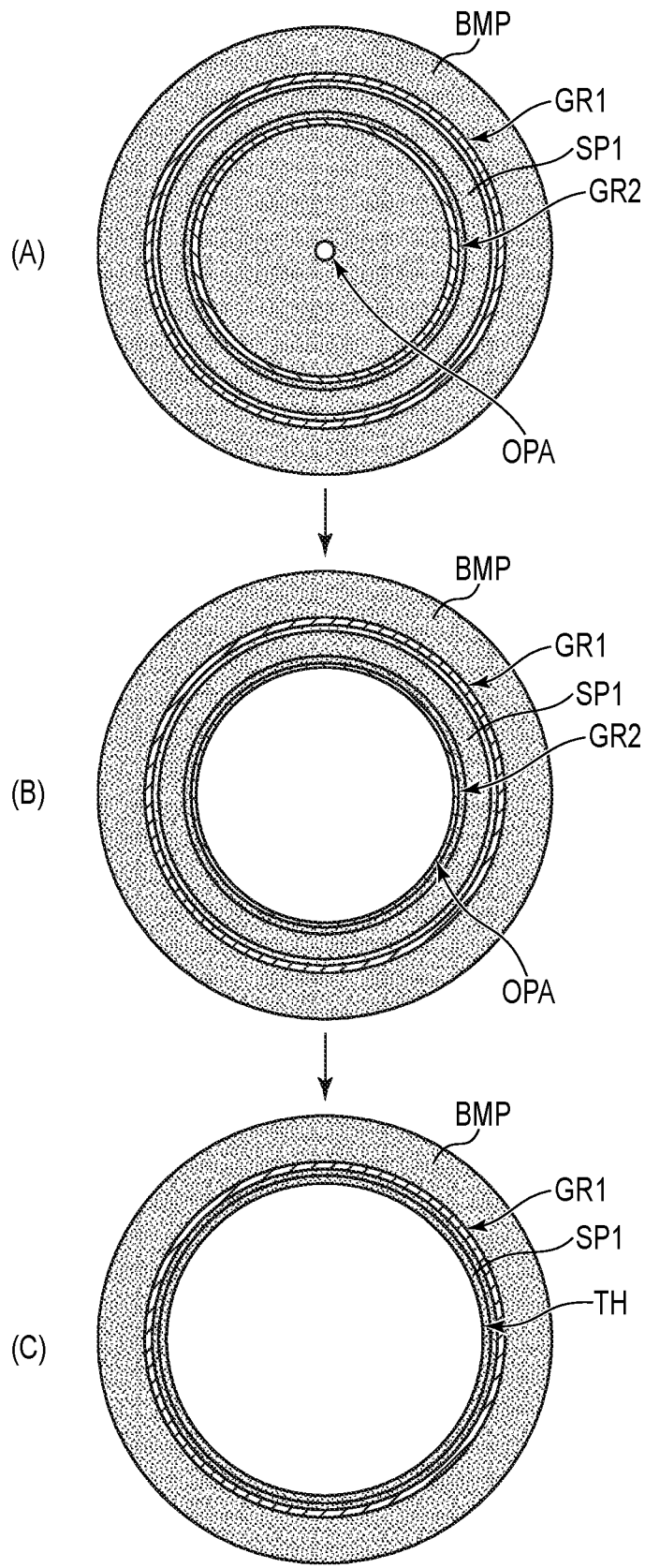
FIG. 12 is a diagram for describing the manufacturing method in FIG. 11 in detail, and is a sectional view illustrating a manufacturing method for providing the through hole in the display panel.

FIG. 12 is a diagram for describing the manufacturing method of FIG. 11 in detail, and is a sectional view illustrating a manufacturing method of providing the through hole TH in the display panel PNL.

As illustrated in FIG. 12(A), a through hole OPA serving as a starting point is provided inside the groove GR2 in a planar view by the punching portion DR illustrated in FIG. 11. After the through hole OPA is provided, the through hole OPA is expanded by the hole expansion portion BP illustrated in FIG. 11, as illustrated in FIG. 12(B). An outer periphery of the expanded through hole OPA is located in the groove GR2. The through hole OPA is further expanded to form the through hole TH as illustrated in FIG. 12(C). The through hole TH is located inside the groove GR2 in a planar view.

According to the present embodiment, the light-shielding layer BMP includes the groove GR1 located in the frame area FRA and the groove GR2 located in the first area 1A. When the display panel PNL is viewed in a planar view from the second substrate SUB2 toward the first substrate SUB1, for example, the groove GR1 can be visually recognized as a blue ring, and the groove GR2 can be visually recognized as a white ring in the black light-shielding layer BMP. As a result, after the manufacturing process of providing the through hole TH in the display panel PNL, it is possible to easily visually confirm the dimension of the through hole TH such that the size of the through hole TH is small when the groove GR2 remains and the size of the through hole TH is large when the groove GR1 does not remain, and it is possible to improve productivity. Further, the plurality of metal lines MM are arranged at regular intervals between the groove GR1 and the groove GR2. When the display panel PNL is viewed in a planar view from the first substrate SUB1 toward the second substrate SUB2, the plurality of metal lines MM can be visually recognized as a scale between the groove GR1 and the groove GR2. As a result, even when the display panel PNL is viewed from the first substrate SUB1 side, the dimension of the through hole TH can be visually confirmed.

The second substrate SUB2 includes a plurality of spacers SP4 located between the fourth portion 15B and the light-shielding layer BMP in the first area 1A. As a result, the cell gap in the first area 1A of the display panel PNL is maintained.

In the present embodiment, the groove GR2 corresponds to a second groove, the insulating layer 12 corresponds to a first inorganic insulating layer, the insulating layer 13 corresponds to a second inorganic insulating layer, and the metal line MM corresponds to a second metal line.

As described above, according to the present embodiment, it is possible to provide a display device capable of improving a manufacturing yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate;
a second substrate;
a through hole that penetrates the first substrate and the second substrate; and
a facing area in which the first substrate and the second substrate face to each other,
wherein
the facing area includes a display area that is located outside the through hole in a planar view and displays an image, and a frame-shaped frame area that is located between the through hole and the display area and surrounds the through hole,
the second substrate includes a light-shielding layer and a colored layer located in the frame area, the light-shielding layer includes a first groove formed in a closed annular shape along the through hole and penetrating from the first substrate toward the second substrate, and the colored layer is located in the first groove and is provided in an entire area of the first groove in a planar view.

2. The display device according to claim 1, further comprising:

a sealant that is formed in a closed annular shape along the through hole in the frame area and bonds the first substrate and the second substrate; and a liquid crystal layer located between the first substrate and the second substrate and provided in the display area, wherein the liquid crystal layer is in contact with the sealant.

3. The display device according to claim 2, wherein the first substrate includes:

a first organic insulating layer having a first portion in the frame area;

a first metal line formed above the first portion; and a second organic insulating layer formed above the first portion and the first metal line and having an opening at a position not overlapping the first metal line in the frame area.

4. The display device according to claim 2, further comprising a photoreceiver located in the through hole.

5. A display panel comprising:

a first substrate;

a second substrate; and a facing area in which the first substrate and the second substrate face each other, wherein the facing area includes a display area for displaying an image, a hole-processing area located outside the display area in a planar view, and a frame-shaped frame area located between the display area and the hole-processing area and surrounding the hole-processing area, the second substrate includes:

a light-shielding layer including a first groove located in the frame area and a second groove located in the hole-processing area and separated from the first groove; and a colored layer, the first groove is formed in a closed annular shape along the hole-processing area, the second groove is formed in an annular shape along the first groove, and the colored layer is located in the first groove and is provided in an entire area of the first groove in a planar view.

6. The display panel according to claim 5, wherein the first substrate includes:

a first inorganic insulating layer;

a plurality of second metal lines formed above the first inorganic insulating layer; and a second inorganic insulating layer that covers each of the plurality of second metal lines and is in contact with the first inorganic insulating layer, and the plurality of second metal lines are located between the first groove and the second groove in a planar view, and are annularly disposed.

7. The display panel according to claim 5, further comprising:

a sealant that is formed in a closed annular shape along the hole-processing area in the frame area and bonds the first substrate and the second substrate; and a liquid crystal layer located between the first substrate and the second substrate and provided in the frame area and the display area, wherein the liquid crystal layer is in contact with the sealant in the frame area.

8. The display panel according to claim 7, wherein the first substrate includes:

a first organic insulating layer including a first portion located in the frame area and the display area, and a second portion located in the hole-processing area and separated from the first portion;

a first metal line formed above the first portion in the frame area; and a second organic insulating layer including a third portion formed above the first portion and the first metal line, and a fourth portion formed above the second portion, and the third portion has an opening at a position not overlapping the first metal line in the frame area.

9. The display panel according to claim 8, wherein the second substrate includes a plurality of spacers located between the fourth portion and the light-shielding layer in the hole-processing area.

\* \* \* \* \*